(12) United States Patent
Kwack et al.

(10) Patent No.: US 7,835,001 B2
(45) Date of Patent: Nov. 16, 2010

(54) METHOD OF ALIGNING A SUBSTRATE, MASK TO BE ALIGNED WITH THE SAME, AND FLAT PANEL DISPLAY APPARATUS USING THE SAME

(75) Inventors: Jin-Ho Kwack, Suwon-si (KR); Tae-Kyung Ahn, Suwon-si (KR); Min-Kyu Kim, Suwon-si (KR); Se-Yeoul Kwon, Suwon-si (KR)

(73) Assignee: Samsung Mobile Display Co., Ltd., Gyeonggi-do (KR)

( * ) Notice: Subject to any disclaimer, the term of this patent is extended or adjusted under 35 U.S.C. 154(b) by 451 days.

(21) Appl. No.: 11/802,323

(22) Filed: May 22, 2007

(65) Prior Publication Data
US 2007/0275497 A1  Nov. 29, 2007

(30) Foreign Application Priority Data

| May 24, 2006 | (KR) | ...................... 10-2006-0046575 |
| Jul. 18, 2006 | (KR) | ...................... 10-2006-0067105 |
| Aug. 17, 2006 | (KR) | ...................... 10-2006-0077822 |

(51) Int. Cl.
  *G01B 11/00* (2006.01)
  *G06K 9/00* (2006.01)
  *H04N 7/18* (2006.01)

(52) U.S. Cl. .................. 356/399; 356/400; 356/401; 382/151; 348/95

(58) Field of Classification Search .......... None
See application file for complete search history.

(56) References Cited

U.S. PATENT DOCUMENTS

| 4,052,280 | A | * | 10/1977 | McGinnis | ..................... 522/33 |
| 4,176,281 | A | * | 11/1979 | Tischer et al. | .................. 378/34 |
| 4,964,146 | A | | 10/1990 | Kuniyoshi et al. | |
| 5,084,131 | A | * | 1/1992 | Inoue et al. | ..................... 216/5 |
| 5,216,404 | A | * | 6/1993 | Nagai et al. | ............. 338/22 SD |
| 5,242,641 | A | * | 9/1993 | Horner et al. | ............... 264/104 |
| 5,908,719 | A | * | 6/1999 | Guckel et al. | ................... 430/5 |
| 6,087,719 | A | * | 7/2000 | Tsunashima | ................ 257/686 |
| 6,110,595 | A | * | 8/2000 | Suzuki et al. | .......... 430/270.11 |
| 6,194,101 | B1 | * | 2/2001 | Yano | ............................. 430/5 |
| 6,327,034 | B1 | * | 12/2001 | Hoover et al. | ............... 356/400 |
| 6,362,883 | B1 | * | 3/2002 | Watkins | ..................... 356/399 |
| 6,406,988 | B1 | * | 6/2002 | Chung | ........................ 438/612 |
| 6,799,826 | B2 | * | 10/2004 | Moon et al. | ................... 347/19 |
| 7,031,578 | B2 | * | 4/2006 | Marion et al. | ................. 385/52 |

(Continued)

FOREIGN PATENT DOCUMENTS

JP  62-029139  2/1987

(Continued)

*Primary Examiner*—Tarifur Chowdhury
*Assistant Examiner*—Gordon J Stock, Jr.
(74) *Attorney, Agent, or Firm*—Lee & Morse, P.C.

(57) ABSTRACT

A method of aligning a substrate includes forming a first alignment hole in the substrate, preparing a mask with a second alignment hole narrower than the first alignment hole, modifying a surface reflectance around either the first alignment hole or the second alignment hole to form a treatment region, positioning the mask below the substrate, such that the first and second alignment holes overlap, and operating a sensor unit above the first alignment hole to examine alignment of the first and second alignment holes.

17 Claims, 8 Drawing Sheets

U.S. PATENT DOCUMENTS

| | | | |
|---|---|---|---|
| 2005/0105009 A1* | 5/2005 | Dunn et al. | 349/21 |
| 2005/0241754 A1* | 11/2005 | Iri et al. | 156/268 |
| 2006/0027809 A1 | 2/2006 | Ogawa et al. | |
| 2006/0086321 A1* | 4/2006 | Brody et al. | 118/720 |
| 2006/0158074 A1* | 7/2006 | Kang et al. | 313/36 |
| 2007/0262936 A1* | 11/2007 | Chang et al. | 345/87 |
| 2007/0290616 A1* | 12/2007 | Lee et al. | 313/512 |
| 2008/0042929 A1* | 2/2008 | Kim et al. | 345/55 |

FOREIGN PATENT DOCUMENTS

| | | |
|---|---|---|
| JP | 03-054814 | 3/1991 |
| JP | 2001-085302 | 3/2001 |
| KR | 2003029697 A * | 4/2003 |
| KR | 10/2006-0050318 A | 5/2006 |
| KR | 10-2006-0071610 A | 6/2006 |

* cited by examiner

METHOD OF ALIGNING A SUBSTRATE, MASK TO BE ALIGNED WITH THE SAME, AND FLAT PANEL DISPLAY APPARATUS USING THE SAME

BACKGROUND OF THE INVENTION

1. Field of the Invention

The present invention relates to a method of aligning a substrate, a mask to be aligned with the substrate, and a flat panel display apparatus using the same. More particularly, the present invention relates to a method of providing efficient alignment of an opaque substrate with a patterning/deposition mask.

2. Description of the Related Art

Generally, flat panel display apparatuses have thin and light display panels exhibiting superior display characteristics as compared to other display devices, e.g., excellent visibility, wide viewing angles, high contrast, and high response speed. For example, an organic electroluminescent (EL) display device, i.e., a display device employing voltage between two electrodes to excite electrons in an organic light emitting layer between the electrodes, may further exhibit high luminance and driving voltage to enable improved color purity and display.

Manufacturing of flat panel apparatuses may require, inter alia, deposition and patterning of thin films. Conventional methods of thin film deposition on a substrate may include a vacuum evaporation method, an ion plating method, a sputtering method, a chemical vapor deposition method, and so forth. Conventional methods of patterning may include wet etching. For example, manufacturing of the conventional organic EL display device may require deposition of at least one electrode, i.e., a first electrode, and an organic light emitting layer by the vacuum evaporation method, followed by patterning via wet etching, e.g., photolithography. In order to minimize deterioration of the organic light emitting layer during the wet etching, e.g., due to contact with moisture and oxygen, simultaneous film deposition and patterning may be performed. For example, the conventional method of simultaneous film deposition and patterning may provide attachment of a mask with a predetermined pattern to a substrate, so that material deposited onto the substrate via the mask may be formed at the predetermined pattern of the mask.

However, simultaneous deposition and patterning may require accurate alignment between the substrate and the mask. For example, a conventional alignment of a mask and a flexible substrate, e.g., a synthetic resin, may require a complex procedure for aligning multiple layers, e.g., a light emitting layer, a driving thin film transistor layer, an electrode layer, and so forth, while imparting minimized deformation to the flexible substrate. On the other hand, a conventional alignment of a mask and an opaque substrate, e.g., a metal substrate, may require accurate alignment via alignment holes in the opaque substrate and the mask.

However, due to the opaque material employed to form the opaque substrate, the reflectance thereof may be similar to the reflectance of the mask, thereby reducing visibility of a boundary line between the substrate and the mask. As such, accurate alignment of the substrate and the mask may be difficult, while a confirmation of a proper alignment via optical devices, e.g., an optical sensor, may be incorrect. Accordingly, there exists a need for a method capable of providing effective alignment of an opaque substrate with a mask.

SUMMARY OF THE INVENTION

The present invention is therefore directed to a method of aligning a substrate, a mask, and a flat panel display apparatus using the same, which substantially overcome one or more of the disadvantages of the related art.

It is therefore a feature of an embodiment of the present invention to provide a method capable of providing effective alignment of an opaque substrate with a patterned mask.

At least one of the above and other features and advantages of the present invention may be realized by providing a method of aligning a substrate, including forming a first alignment hole in the substrate, preparing a mask with a second alignment hole, the second alignment hole having a smaller width than the first alignment hole, modifying a surface reflectance around either the first alignment hole or the second alignment hole to form a treatment region, positioning the mask below the substrate, such that the first and second alignment holes overlap, and operating a sensor unit above the first alignment hole to examine alignment of the first and second alignment holes.

The substrate may be made of an opaque material. The opaque material may be metal. Operating a sensor unit may include operating a CCD camera. Modifying the surface reflectance may include modifying a surface roughness or a surface color. Forming the treatment region may include forming a region having an inner boundary concentric with a corresponding first or second alignment hole.

Forming the treatment region may include irradiating an area on an upper surface of the substrate around the first alignment hole. Forming the treatment region may include irradiating an area having a distance between the inner boundary and the outer boundary of about 1 mm or less. Forming the treatment region may include etching or melting. Forming the treatment region may include irradiating an area to a thickness of about 30 μm to about 100 μm.

Alternatively, forming the treatment region may include treating an area on an upper surface of the mask around the second alignment hole. Forming the treatment region may include laser irradiation, metal deposition, chemical mechanical polishing or sand blasting. Forming the treatment region may include forming a region having the inner boundary spaced apart from the second alignment hole. Forming the treatment region may include forming the inner boundary to have a narrower width than a width of the first alignment hole. Forming the treatment region may include forming the outer boundary to have a wider width than the first alignment hole upon alignment of the substrate with the mask.

At least one of the above and other features and advantages of the present invention may be further realized by providing a display device, including a substrate having an alignment hole and a treatment region around the alignment hole, the treatment region exhibiting a substantially different reflectance as compared to an upper surface of the substrate, and a light display element on the upper surface of the substrate. The light display element may be an organic light emitting diode.

At least one of the above and other features and advantages of the present invention may be also realized by providing a mask to be aligned with a substrate having a first alignment hole, the mask including a second alignment hole smaller than the first alignment hole of the substrate, and a treatment region around the second alignment hole, the treatment region exhibiting a substantially different reflectance as compared to the mask. The treatment region may have an inner boundary having a width smaller than a width of the first alignment hole, and an outer boundary having a width wider than a width of the first alignment hole. The treatment region may include a thin metal layer having a higher reflectance as compared to the mask.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Korean Patent Application No. 10-2006-0046575, filed on May 24, 2006, No. 10-2006-0067105, filed on Jul. 18, 2006, and No. 10-2006-0077822, filed on Aug. 17, 2006, in the Korean Intellectual Property Office, and entitled: "Method of Aligning Substrate and Flat Panel Display Apparatus Using the Same," are incorporated by reference herein in their entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on" another layer or substrate, it can be directly on the other layer or substrate, or intervening layers or elements may also be present. Further, it will be understood that when a layer or element is referred to as being "under" another layer or element, it can be directly under, and one or more intervening layers or elements may also be present. In addition, it will also be understood that when a layer or element is referred to as being "between" two layers or elements, it can be the only layer or element between the two layers or elements, or one or more intervening layers or elements ay also be present. Like reference numerals refer to like elements throughout.

Hereinafter, an exemplary embodiment of a method of aligning a substrate and a mask according to the present invention will be described in more detail with reference to FIGS. 1-5.

Figure 1:
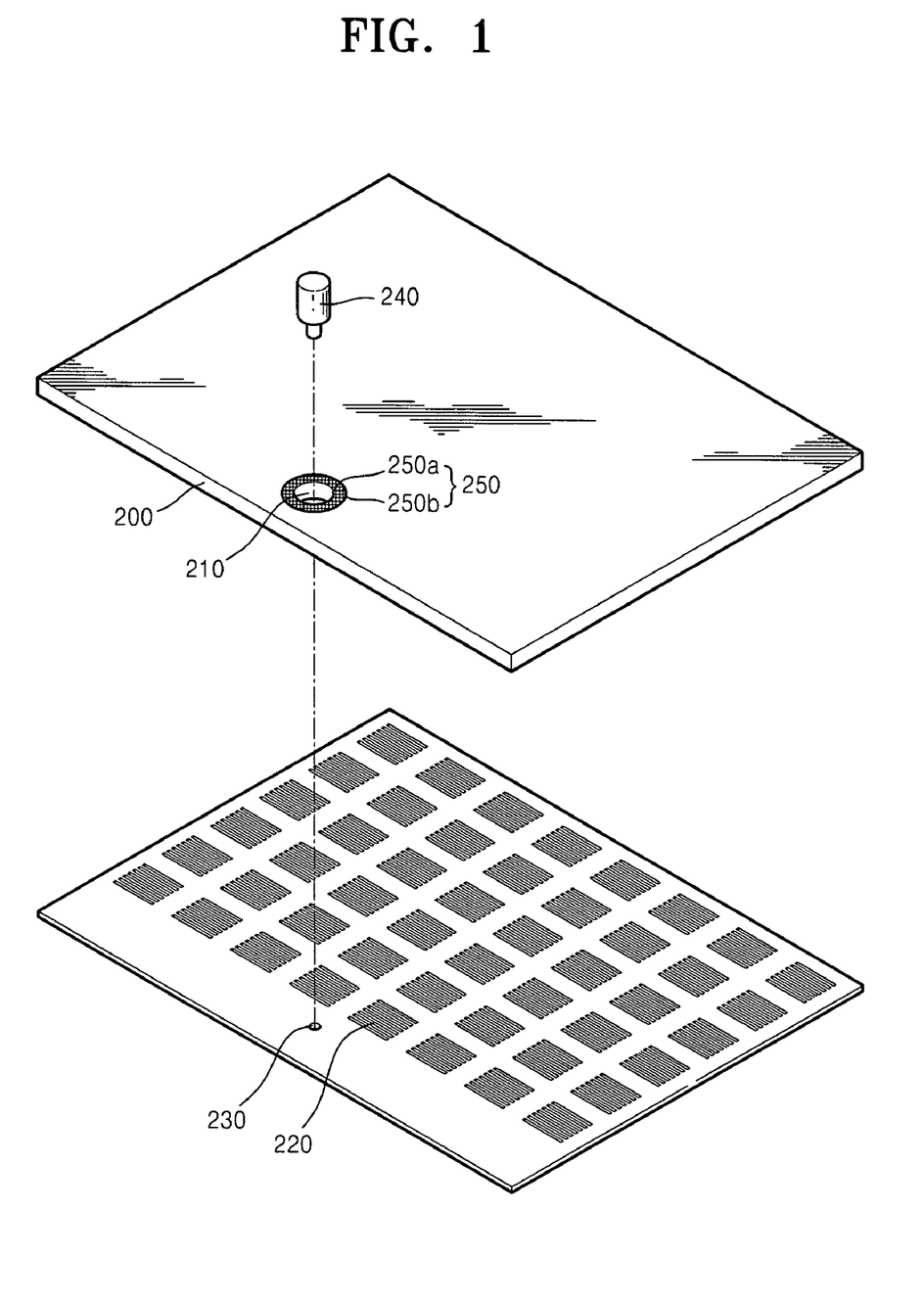
FIG. 1 illustrates a schematic perspective view of a method of aligning a substrate having a treatment region according to an embodiment of the present invention.

As illustrated in FIG. 1, a first alignment hole 210 with a treatment region 250 may be formed in a substrate 200. Next, a mask 220 with a second alignment hole 230 may be positioned below the substrate 200, so that the first alignment hole 210 and the second alignment hole 230 may be substantially aligned. Finally, a sensor unit 240 may be positioned above the first alignment hole 210 of the substrate 200 in order to determine proper alignment of the first and second alignment holes 210 and 230.

The substrate 200 may be any suitable substrate employed in a flexible flat panel display device as determined by one of ordinary skill in the art. The substrate 200 may be made of an opaque material, such as metal, e.g., steel use stainless (SUS).

The first alignment hole 210 may be formed through the substrate 200 and in close proximity to an edge thereof. In other words, the first alignment hole 210 may be formed sufficiently close to an edge of the substrate 200 to avoid an overlap between the treatment region 250 of the substrate 200 with any essential components of the flat panel display device. On the other hand, the first alignment hole 210 may be formed sufficiently far from the edge of the substrate 200 to avoid an overlap between the treatment region 250 with the edge of the substrate 200. The first alignment hole 210 may have a first width w1, as measured along a horizontal direction and illustrated in FIG. 2, e.g., if the first alignment hole 210 has a circular shape, the first width w1 may equal a diameter of the first alignment hole 210.

The treatment region 250 may be formed on an upper surface of the substrate 200 around the first alignment hole 210. For example, as illustrated in FIG. 1, the treatment region 250 may have a shape of a ring having an inner boundary 250a and an outer boundary 250b, so that the outer boundary 250b may have a larger width than the inner boundary 250a. The first alignment hole 210 of the substrate 200 may be concentric to the inner boundary 250a, and the inner boundary 250a of the treatment region 250 may be in communication with an edge of the first alignment hole 210.

Figure 2:
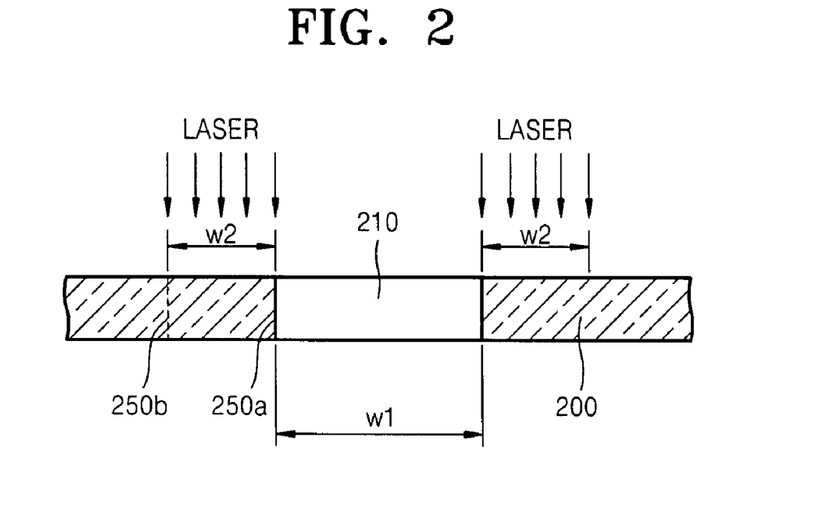
FIG. 2 illustrates a conceptional cross-sectional view of forming the treatment region illustrated in FIG. 1.

The treatment region 250 may be formed to exhibit a substantially different surface reflectance as compared to a surface reflectance of the substrate 200. In this respect, it should be noted that the substantially different surface reflectance refers to a difference in reflectance capable of being detected by a standard optical sensor as may be used by one of ordinary skill in the art, e.g., a charged coupled device (CCD) camera. The surface reflectance may be modified by a laser beam of a laser ablation device. For example, as illustrated in FIG. 2, an area surrounding the first alignment hole 210 may be irradiated to modify a surface texture thereof, e.g., visually and/or physically, to form the treatment region 250 with a second width w2 and a rougher surface texture as compared to a surface texture of the substrate 200, i.e., a higher average roughness values with respect to height of bumps on a surface. The treatment region 250 formed by the laser beam may also have a surface color that is different from the color of the substrate 200.

Figure 3:
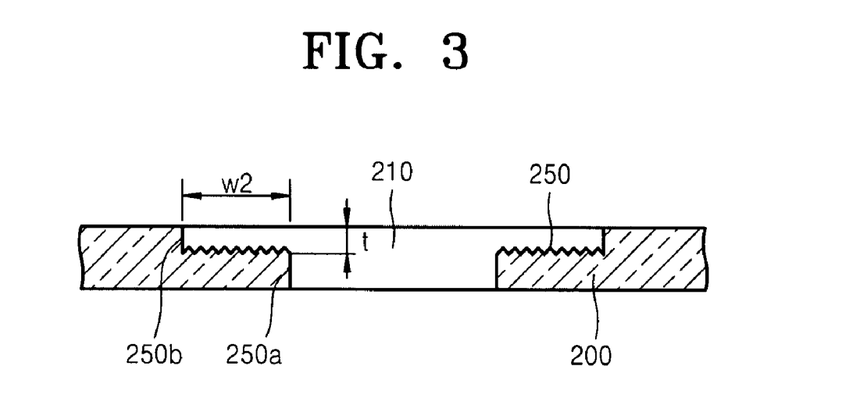
FIG. 3 illustrates a cross-sectional view of a treatment region formed by etching according to an embodiment of the present invention.

More specifically, as illustrated in FIG. 3, the substrate 200 may be etched to a predetermined thickness to form the treatment region 250. In other words, the laser beam intensity may be adjusted to remove portions from the substrate 200, so the treatment region 250 may have a thickness t, i.e., a vertical distance as measured in a downward direction from an upper surface of the substrate 200 that is lower than a thickness of the substrate 200. For example, the thickness t of the treatment region 250 may equal half a thickness of the substrate 200. The thickness t may be in the range of about 30 μm to about 100 μm. The thickness t of the irradiation region 250 may be controlled by adjusting the intensity of the laser beam of the laser ablation device or by using a mask. As further illustrated in FIG. 3, the treatment region 250 may further have the second width w2, i.e., a horizontal distance as measured between the inner and outer boundaries 250a and 250b, having a value of about 1 mm or less.

Figure 4:
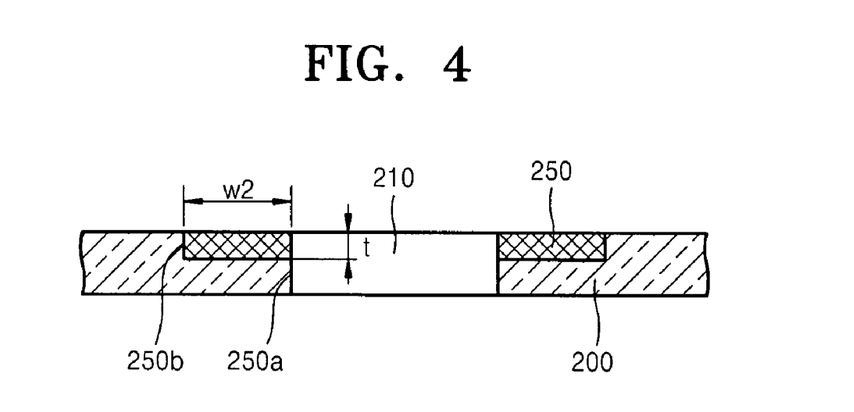
FIG. 4 illustrates a cross-sectional view of a treatment region formed by melting according to an embodiment of the present invention.

Alternatively, as illustrated in FIG. 4, the substrate 200 may be heat treated by a laser beam to form the treatment region 250. In other words, the intensity of the laser beam may be adjusted to partially melt the upper surface of the substrate 200 to the thickness t and the second width w2. The thickness t and second width w2 of the treatment region 250 formed by surface melting may be similar to the thickness t and second width w2 of the treatment region 250 formed by surface etching. Similarly, the color and roughness of the surface of the treatment region 250 formed by heat treatment may be different as compared to the substrate 200. For example, the surface of the treatment region 250 formed by melting may be darker as compared to the substrate 200.

Without intending to be bound by theory, it is believed that forming the treatment region 250 with a surface roughness and/or surface color different than the surface of the substrate 200 may facilitate optical distinction therebetween. For example, the increased surface roughness in the treatment region 250 may provide different reflectance as compared to the reflectance of the substrate 200. Different reflectance values may facilitate improved optical detection of a boundary line between the treatment region 250 and the substrate 200 and, thereby, enable location of the first alignment hole 210 with respect to a center of the treatment region 250.

Figure 5:
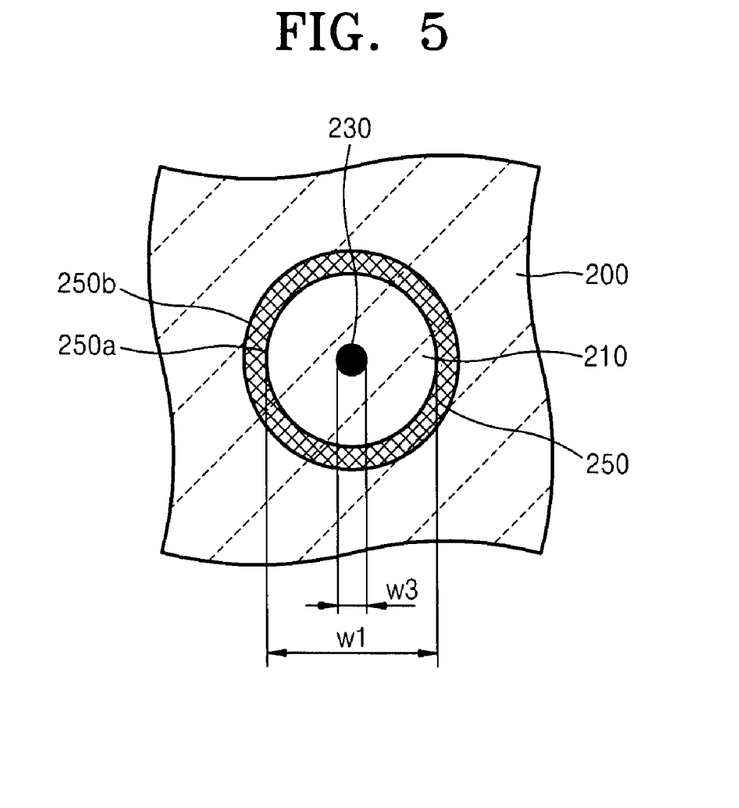
FIG. 5 illustrates a plan view of a substrate and a mask aligned according to the alignment method illustrated in FIG. 1.

The mask 220 positioned below the substrate 200, as illustrated in FIG. 1, may be made of metal, e.g., nickel or stainless steel, and may include a predetermined pattern to be imparted to a film deposited on the substrate 200. The predetermined pattern may be formed in the mask 220, e.g., by etching. The second alignment hole 230 may be formed through the mask 220, e.g., by punching. The second alignment hole 230 may have a third width w3, as illustrated in FIG. 5, that is smaller than the first alignment hole 210. It is believed that different widths of the first and second alignment holes 210 and 230 may facilitate optical recognition of each of the first and second alignment holes 210 and 230. It should be noted, however, that other types and configurations of masks for depositing a pattern on the substrate 200 are not excluded from the scope of the present invention.

The sensor unit 240 may be disposed above the upper surface of the substrate 200, so that the substrate 200 may be positioned between the sensor unit 240 and the mask 220. More specifically, the sensor unit 240 may be positioned directly above the first alignment hole 210, and may include a camera, e.g., a CCD, to check alignment between the substrate 200 and the mask 220, i.e., alignment between the first and second alignment holes 210 and 230. Proper alignment between the first and second alignment holes 210 and 230 may vertically line up centers of the first and second alignment holes 210 and 230, so that the second alignment hole 230 may be seen through the first alignment hole 210 due to the difference of widths thereof.

More specifically, as illustrated in FIG. 5, the treatment region 250 may surround the first alignment hole 210 of the substrate 200, while the second alignment hole 230 may be seen through the first alignment hole 210. Accordingly, proper alignment of the first and second alignment holes 210 and 230 may enable the sensor unit 240 to capture and display an image of the first and second alignment holes 210 and 230. Further, the different surface reflectance of the treatment region 250 as compared to the substrate 200 may facilitate proper visual identification of the first alignment hole 210 in the image produced by the sensor unit 240. Visual identification of the first alignment hole 210, e.g., due to darker surface color of the irradiation region 250, by the sensor unit 240 may provide a convenient method of confirming positioning of the second alignment hole 230 of the mask 220 with respect to the center of the first alignment hole 210 of the substrate 200. Accordingly, the substrate 200 may be easily aligned with the mask 220.

Figure 6:
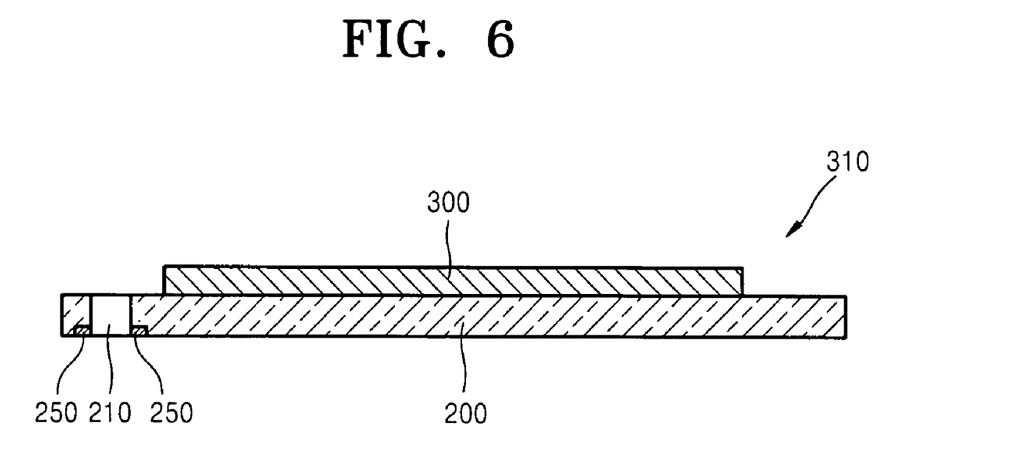
FIG. 6 illustrates a schematic cross-sectional view of a flat display apparatus having a substrate with a treatment region according to an embodiment of the present invention.

Once the substrate 200 is aligned with the mask 220, a light display element may be mounted on the substrate 200. For example, as illustrated in FIG. 6, a light display element 300 may be deposited and patterned on an upper surface of the substrate 200 to form a flat display device 310. The light display element 300 may be a light emitting element, e.g., a light emitting diode, or a liquid crystal display element.

Figure 7:
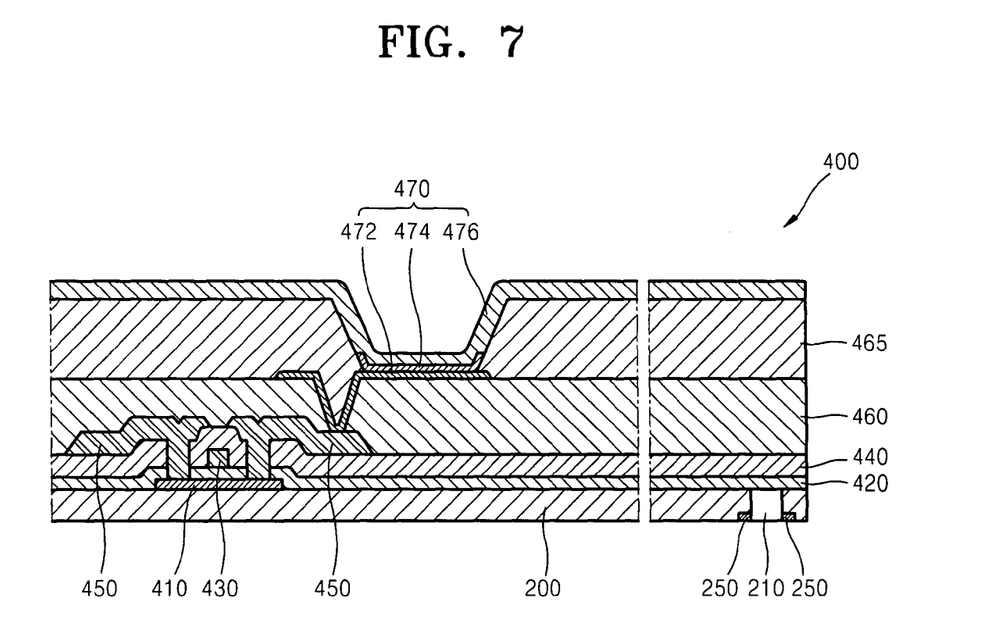
FIG. 7 illustrates a schematic cross-sectional view of an organic EL display device according to an embodiment of the present invention.
Figure 8:
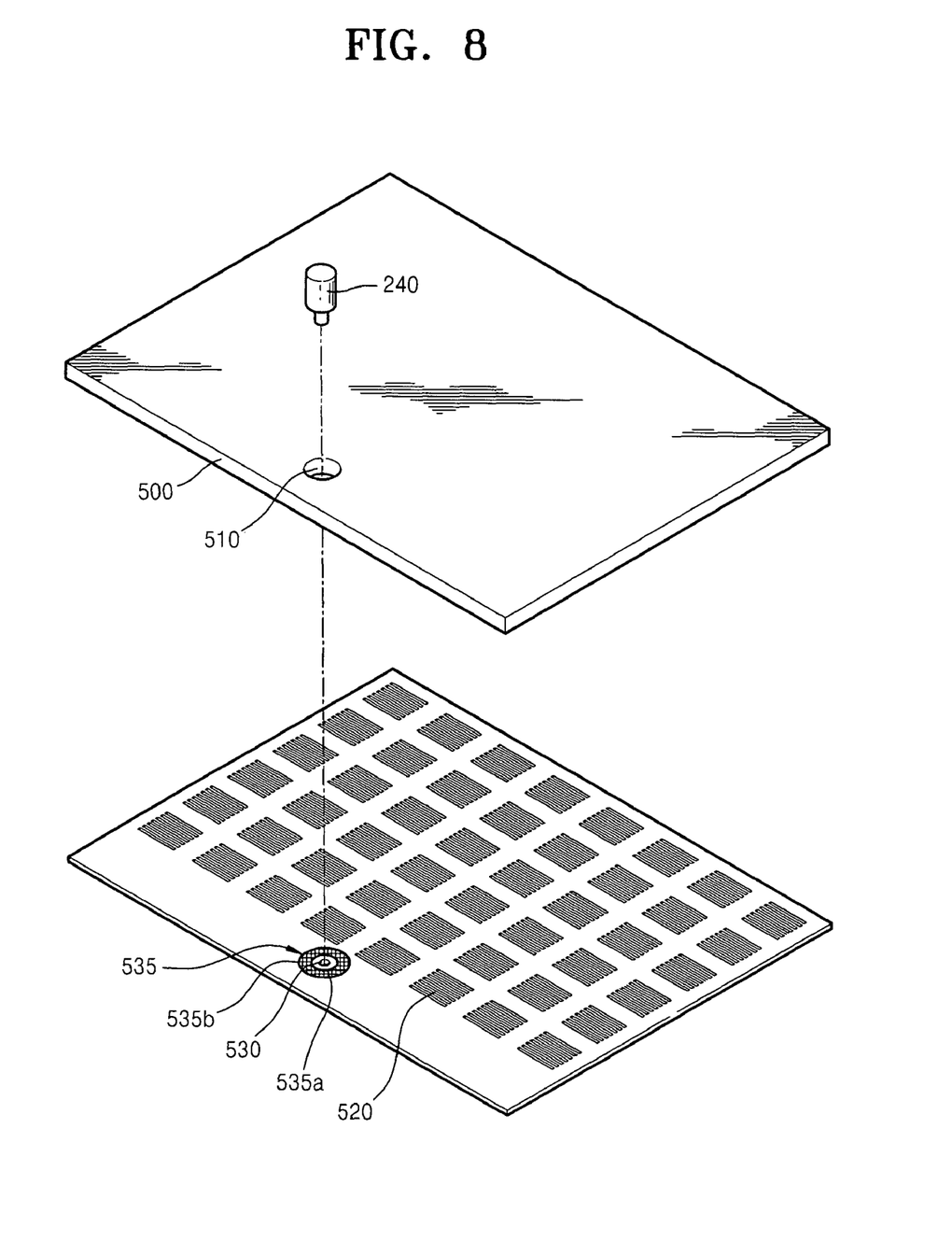
FIG. 8 illustrates a schematic perspective view of a method of aligning a substrate having a treatment region according to another embodiment of the present invention.

According to another exemplary embodiment of the present invention, an EL display device may be manufactured by, inter alia, aligning the substrate 200 with the mask 220 according to the embodiment described previously with respect to FIGS. 1-5. For example, as illustrated in FIG. 7, an EL display device 400 may include the substrate 200 and a light emitting element 470 on the substrate 200. In this respect it should be noted that the EL display device 400 depicts an active matrix (AM) light emitting display device with a thin film transistor (TFT). However, other types of light emitting display devices are not excluded from the scope of the present invention.

The EL display device 400 may include a TFT on the substrate 200 and a buffer layer (not shown) formed as an insulator between the substrate 200 and the TFT. More specifically, a semiconductor layer 410 may be formed on the substrate 200. Once the semiconductor layer 410 is formed, a gate insulating film 420 and a gate electrode 430 may be formed sequentially on the semiconductor layer 410. Next, an interlayer insulating film 440 may be formed on the gate electrode 430 to coat the gate electrode 430 and the gate insulating film 420. Contact holes may be formed in the interlayer insulating film 440 and the gate insulating film 420, so that upon formation of source/drain electrodes 450 on the interlayer insulating film, electrical contact may be established between the source/drain electrodes 450 and the semiconductor layer 410. In this respect, it should be noted that even though the TFT described above is a top-gate type TFT, other types of TFTs are not excluded from the scope of the present invention.

The EL display device 400 may further include a passivation film 460 on the TFT, the light emitting element 470 on the passivation film 460, and a pixel defining film 465 to coat the passivation film 460. The passivation film 460 may be made of an inorganic and/or organic material, and may have a flat upper surface regardless of a curvature of a lower surface. Alternatively, the passivation film 460 may have a curved upper surface, so that a curvature of the upper surface may be identical to the curvature of the lower surface. The pixel defining film 465 may be a non-continuous layer, so that an opening may be formed therein to expose a portion of the light emitting element 470.

The light emitting element 470 of the EL display device 400 may include a pixel electrode 472, a light emitting layer 474, and an opposite electrode 476. The pixel electrode 472 may be formed on the passivation film 460 and be in electric communication with the drain electrode 450 of the TFT through a via hole in the passivation film 460. Next, the light emitting layer 474, e.g., made of an organic material, and the opposite electrode 476 may be sequentially deposited on the pixel electrode 472, i.e., the pixel and opposite electrodes 472 and 476 may be separated from each other by the light emitting layer 474. The pixel electrode 472 may function as an anode electrode, and the opposite electrode 476 may function as a cathode electrode. The polarities of the pixel electrode 472 and the opposite electrode 476 may be switched. Accordingly, voltage may be applied to the pixel and opposite electrodes 472 and 476 to trigger excitation of the light emitting layer 474 therebetween. Once the pixel electrode 472, light emitting layer 474, and opposite electrode 476 are formed, the light emitting element 470 may be hermetically sealed.

The pixel electrode 472 may be made of a material having a high work function, e.g., a transparent conductive material, such as indium-tin-oxide (ITO), indium-zinc-oxide (IZO), indium oxide ($In_2O_3$), zinc oxide (ZnO), and so forth. The opposite electrode 476 may include a metal having a low work function, e.g., silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or a combination thereof.

The light emitting layer 474 may be deposited by vacuum evaporation method, and may be made of a low molecular weight organic molecule or a polymer. When the light emitting layer 474 includes a low molecular weight organic molecule, e.g., copper phthalocyanine (CuPc), N,N'-di-(naphthalene-1-yl)-N,N'-diphenyl-benzidine (NPB), or tris-8-hydroxyquinoline aluminum (Alq3), and so forth, a hole injection layer (HIL), a hole transport layer (HTL), a light emitting layer (EML), an electron transport layer (ETL), and an electron injection layer (EIL) may be formed therein in a single or a composite structure. The HIL, ETL and EIL of the light emitting layer 474 may be used for depositing red, green and blue pixels. Accordingly, the light emitting layer 474 may be formed to coat the entire pixel defining film 465 (not shown).

Alternatively, when the light emitting layer 474 is made of the polymer, the light emitting layer 474 may include a HTL and an EML. The HTL may include, e.g., poly-3,4-ethylenedioxythiophene (PEDOT), and the EML may include, e.g., poly-phenylenevinylene (PPV) based material and/or a polyfluorene based material. The HTL and the EML may be formed by using a screen printing or an inkjet printing method. It should be noted, however, that other materials for forming the light emitting layer 474 are not excluded from the scope of the present invention.

According to yet another exemplary embodiment of the present invention illustrated in FIGS. 8-13, a method of aligning a substrate with a mask may include formation of a first alignment hole 510 in a substrate 500, formation of a second alignment hole 530 with a treatment region 535 in a mask 520, and aligning the first and second alignment holes 510 and 530, so that the sensor unit 240 may be positioned above the substrate 500 to determine proper alignment of the first and second alignment holes 510 and 530.

In this respect, it should be noted that the mask 520 and the substrate 500, with the exception of formation of the treatment region therein, are similar to the mask 220 and the substrate 200 described previously with respect to FIGS. 1-5 and, therefore, their description will not be repeated herein. Similarly, formation of the respective first and second alignment holes, their size ratio, and location are similar in both embodiment and, therefore, will not be repeated herein. In other words, the method illustrated in FIGS. 8-13 is similar to the method illustrated in FIGS. 1-5, with the exception that a treatment region is formed in the mask 520 and not in the substrate 500.

More specifically, the treatment region 535 may be formed on an upper surface of the mask 520 around the second alignment hole 530, so that the second alignment hole 530 may be positioned in a center of the treatment region 535. The treatment region 535 may be formed to have a surface having a reflectance substantially different from a reflectance of the upper surface of the mask 520. For example, as illustrated in FIG. 9, the treatment region 535 may be formed by using a laser ablation device.

In detail, a laser beam may be used to irradiate an area surrounding the second alignment hole 530 to form the treatment region 535, so that the treatment region 535 may have a surface texture that is rougher than a surface texture of the mask 520, i.e., a higher average roughness values with respect to height of bumps on a surface. The treatment region 530 formed by the laser beam may also have a surface color that is different from the color of the mask 520. As further illustrated in FIG. 9, the treatment region 535 may have the thickness t. The thickness t may be determined by one of ordinary skill in the art with respect to a material used to form the mask 520, so that a strength of the mask 520 is not affected. For example, the thickness t may equal about half a thickness of the mask 520. The thickness t of the treatment region 535 may be formed by removing, i.e., etching, portions of the mask 520, applying a mask, and so forth. Upon etching, an upper surface of the treatment region 535 may have a modified surface roughness as compared to the mask 520.

Alternatively, the mask 520 may be heat treated by the laser beam to form the treatment region 535. In other words, the intensity of the laser beam may be increased to partially melt the upper surface of the mask 520 to the thickness t. The thickness t and surface roughness of the treatment region 535 formed by surface melting may be similar to the thickness t of the treatment region 535 formed by surface etching.

Figure 9:
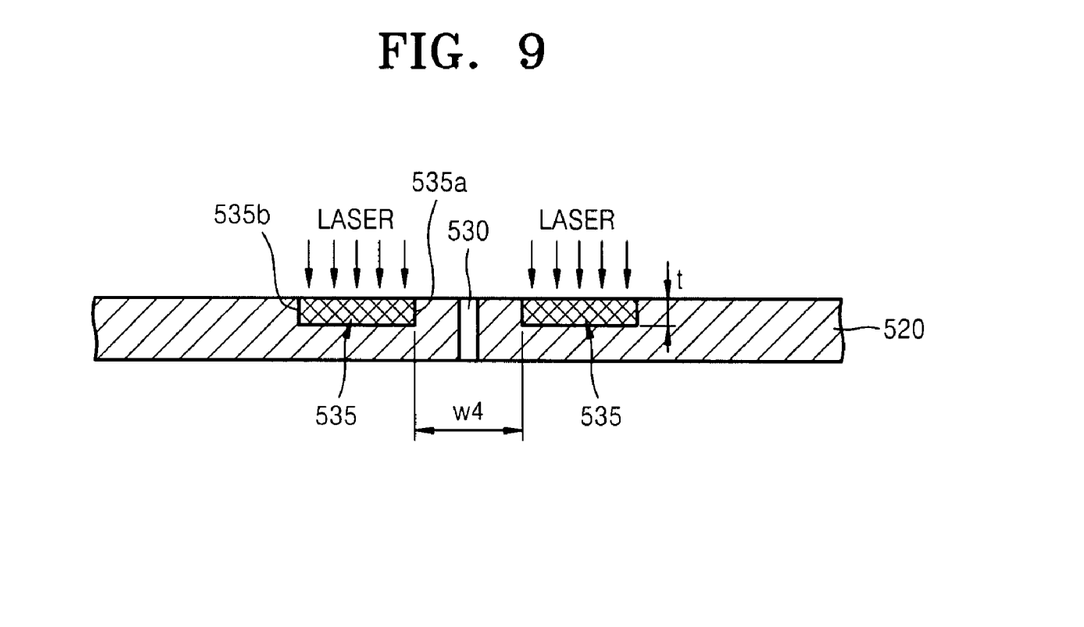
FIG. 9 illustrates a conceptional cross-sectional view of forming the treatment region illustrated in FIG. 8.

As illustrated in FIG. 9, the treatment region 535 may have a shape of a ring having an inner boundary 535a and an outer boundary 535b, so that the second alignment hole 530 of the mask 520 may be concentric to the inner boundary 535a. The outer boundary 535b may have a larger width than the inner boundary 535a, so that the treatment region 535 may have a width corresponding to a horizontal distance as measured between the inner and outer boundaries 535a and 535b. It should be noted, however, that the treatment region 535 should be spaced apart from the second alignment hole 530, i.e., the inner boundary 535a of the treatment region 535 should be positioned at a predetermined distance from the interface between the second alignment hole 530 and the mask 520. If the inner boundary 535a of the treatment region 535 overlaps with the interface between the second alignment hole 530 and the mask 520, i.e., the inner boundary 535a is in communication with the second alignment hole 530, it may be difficult to distinguish the second alignment hole 530 and the treatment region 535 from each other in images produced by the sensor unit 240 due to low reflectance difference therebetween. In other words, the sensor unit 240 may not identify the second alignment hole 530 and/or confirm alignment between the first and second alignment holes 510 and 530 and, thereby, fail to facilitate alignment between the substrate 500 and the mask 520.

Figure 12:
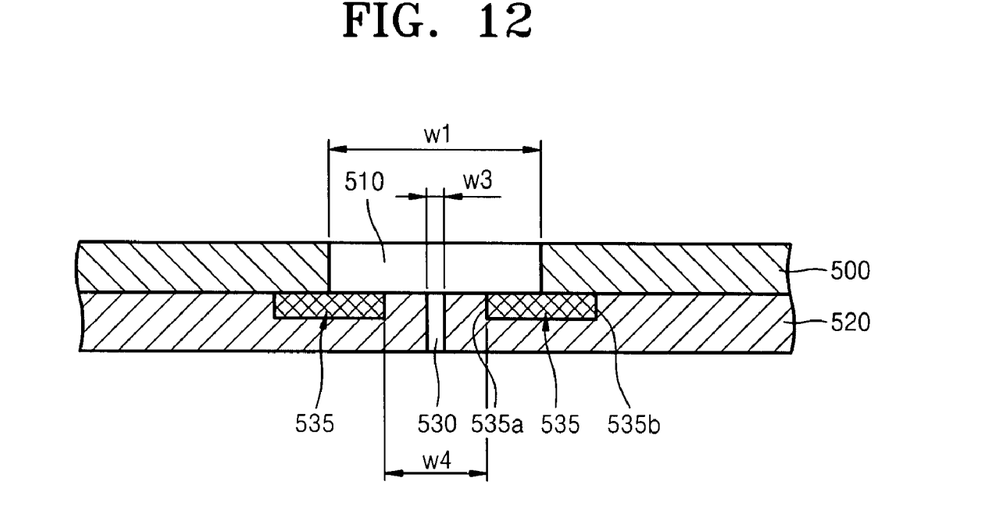
FIG. 12 illustrates a cross-sectional view of a substrate and a mask aligned according to the alignment method illustrated in FIG. 8.

In further detail, as illustrated in FIG. 12, the inner boundary 535a may have a fourth width w4 that is larger than a third width w3 of the second alignment hole 530 and smaller than a first width w1 of the first alignment hole 510. The fourth width w4 of the inner boundary 535a may be smaller than the first width of the first alignment hole 510 to allow the treatment region 535 to be seen through the sensor unit 240. The outer boundary 535b may have a width that is larger than the first width w1 to facilitate detection of the first alignment hole 510 of the substrate 500 through the sensor unit 240 upon alignment of the substrate 500 with the mask 520.

Figure 10:
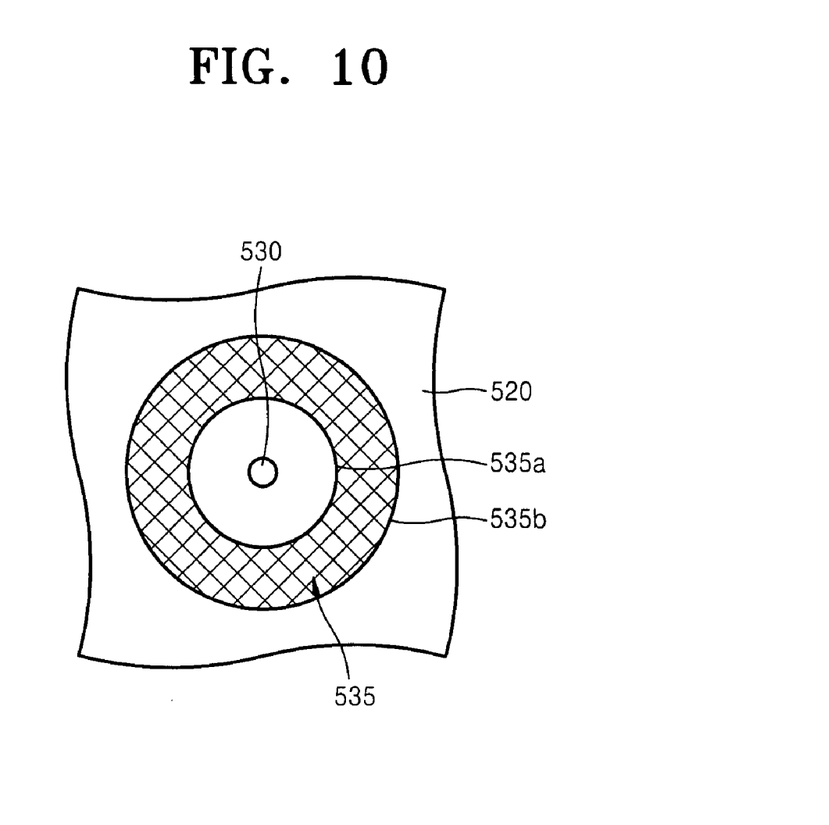
FIGS. 10-11 illustrate plan views of exemplary outer boundaries of the treatment region illustrated in FIG. 8.
Figure 11:
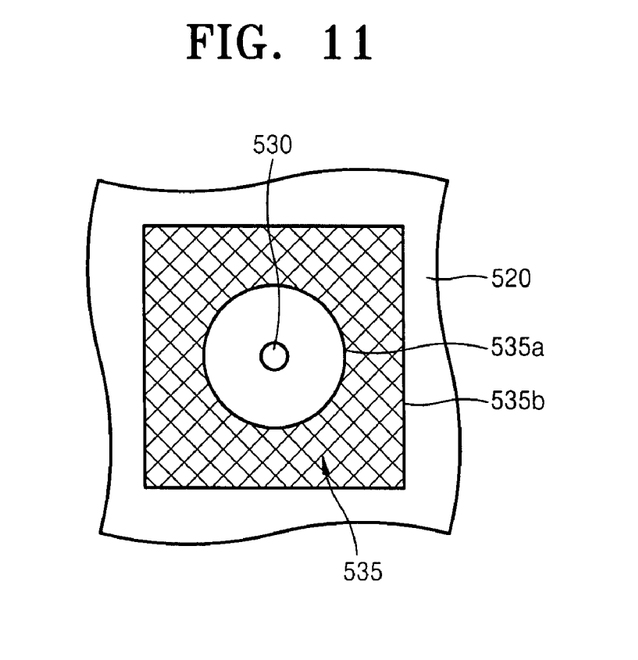
Figure 13:
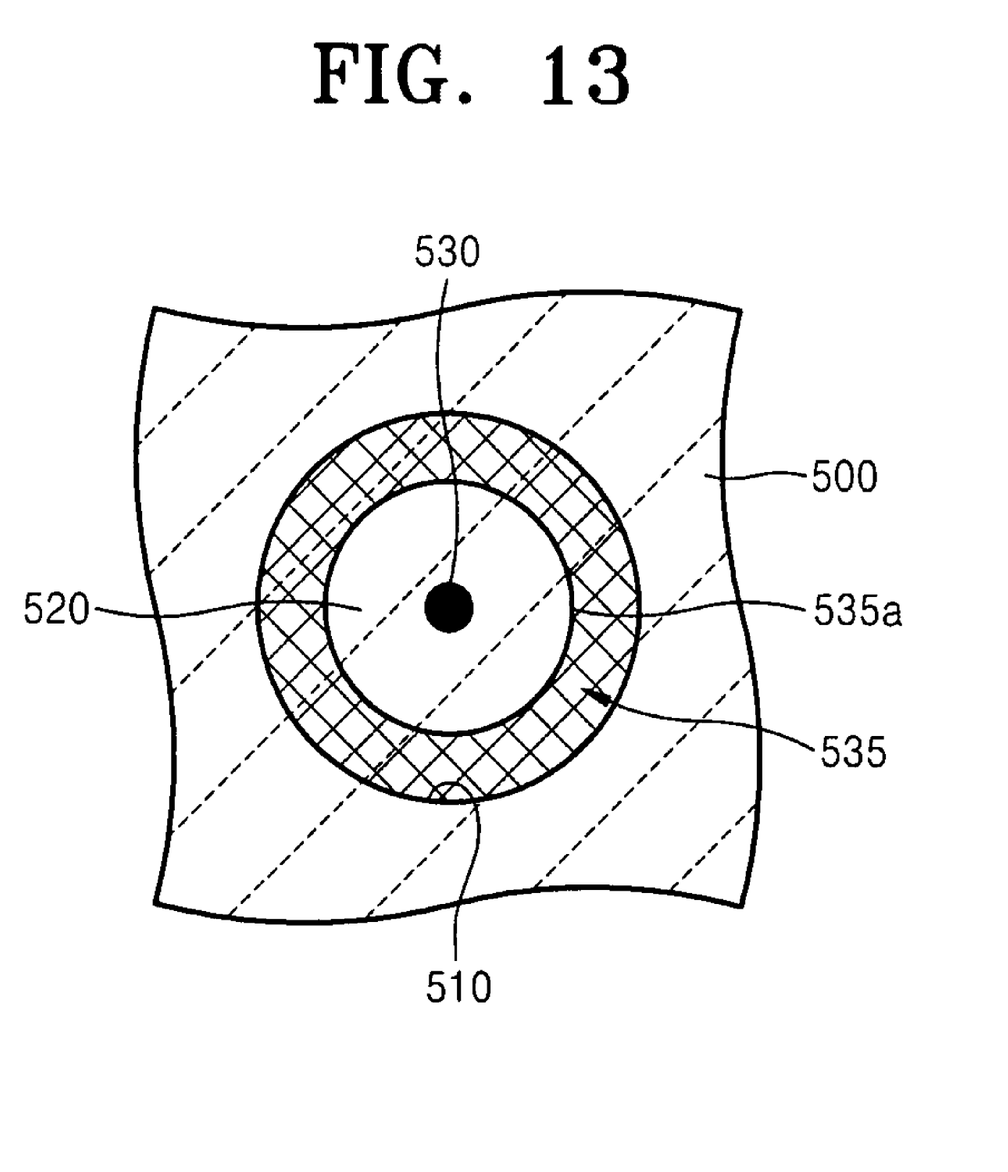
FIG. 13 illustrates a plan view of the substrate and mask illustrated in FIG. 12.

In order to facilitate detection of the first alignment hole 510 further, the outer boundary 535b of the treatment region 535 may be formed in any shape as determined by one of ordinary skill in the art as long as its width is larger than the first width w1 of the first alignment hole 510 upon alignment of the first and second alignment holes 510 and 530. For example, the outer boundary 535b of the treatment region 535 may have a circular perimeter, as illustrated in FIG. 10. Alternatively, the outer boundary 535b of the treatment region 535 may have a rectangular perimeter, as illustrated in FIG. 11. Although the outer boundary 535b of the treatment region 535 may not be seen through the first alignment hole 530 upon alignment of the substrate 500 and the mask 520, as illustrated in FIG. 13, a portion of the treatment region 535 within the first width w1 of the first alignment hole 510 may be seen through the first alignment hole 510 and, therefore, be displayed via the sensor unit 240. As such, the portion of the treatment region 535 exposed through the first alignment hole 510 may be aligned with the first alignment hole 510 and facilitate visual distinction therebetween.

The treatment region 535 may be formed by metal deposition onto the mask 520. More specifically, any mental having a higher reflectance as compared to the mask 520, e.g., aluminum (Ag), silver (Ag), chromium (Cr), platinum (Pt), or an alloy thereof, may be used. Alternatively, the treatment region 535 may be formed via chemical mechanical polishing (CMP). In yet another alternative, the treatment region 535 may be formed using sand blasting, so that the surface roughness of the treatment region 535 may be increased by jetting sand under a high pressure. When the treatment region 535 is formed via metal deposition or CMP, the reflectance of the treatment region 535 may be higher than the reflectance of the surface of the mask 520. Accordingly, the treatment region 535 may appear as a brighter region as compared to the mask 520 when viewed via the sensor unit 240 and, therefore, facilitate alignment of the substrate 500 with the mask 520.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of aligning a substrate, comprising:
   forming a first alignment hole in the substrate;
   preparing a mask with a second alignment hole, the second alignment hole being narrower than the first alignment hole;
   modifying a surface reflectance around the second alignment hole to form a treatment region;
   positioning the mask below the substrate, such that the first and second alignment holes overlap and the treatment region is seen through the first alignment hole; and
   operating a sensor unit above the first alignment hole to examine alignment of the first and second alignment holes.

2. The method as claimed in claim 1, wherein modifying the surface reflectance includes modifying a surface color.

3. The method as claimed in claim 1, wherein operating the sensor unit includes operating a CCD camera.

4. The method as claimed in claim 1, wherein forming the treatment region includes irradiating an area around the second alignment hole having a width of about 1 mm or less.

5. The method as claimed claim 1, wherein forming the treatment region includes etching or melting.

6. The method as claimed in claim 1, wherein forming the treatment region includes irradiating an area around the second alignment hole to a thickness of about 30 μm to about 100 μm.

7. The method as claimed in claim 1, wherein modifying the surface reflectance includes modifying a surface roughness.

8. The method as claimed in claim 1, wherein the substrate is made of an opaque material.

9. The method as claimed in claim 1, wherein forming the treatment region includes forming a region having inner and outer boundaries.

10. The method as claimed in claim 8, wherein the opaque material is metal.

11. The method as claimed in claim 8, wherein the opaque material is metal and the mask is metal.

12. The method as claimed in claim 9, wherein forming the treatment region includes treating an area on an upper surface of the mask around the second alignment hole, so that the inner boundary is concentric with the second alignment hole.

13. The method as claimed in claim 12, wherein forming the treatment region includes laser irradiation, metal deposition, chemical mechanical polishing or sand blasting.

14. The method as claimed in claim 12, wherein forming the treatment region includes forming a region having the inner boundary spaced apart from the second alignment hole.

15. The method as claimed in claim 12, wherein forming the treatment region includes forming the inner boundary narrower than the first alignment hole.

16. The method as claimed in claim 12, wherein forming the treatment region includes forming the outer boundary wider than the first alignment hole.

17. A method of aligning a substrate, comprising:
   forming a first alignment hole in the substrate;
   preparing a mask with a second alignment hole, the second alignment hole being narrower than the first alignment hole;
   modifying a surface reflectance of an upper surface of the mask around the second alignment hole to form a treatment region including a region having inner and outer boundaries, the inner boundary being concentric with the second alignment hole;
   positioning the mask below the substrate, such that the first and second alignment holes overlap; and
   operating a sensor unit above the first alignment hole to examine alignment of the first and second alignment holes.

* * * * *